United States Patent [19]
Bell et al.

[11] Patent Number: 5,332,145
[45] Date of Patent: Jul. 26, 1994

[54] METHODS FOR CONTINUOUSLY CONTROLLING FLUX COMPOSITION DURING MANUFACTURE OF PRINTED CIRCUITS

[75] Inventors: David R. Bell, Spring; Paul V. Brownell, Houston, both of Tex.

[73] Assignee: Compaq Computer Corporation, Houston, Tex.

[21] Appl. No.: 73,157

[22] Filed: Jun. 7, 1993

[51] Int. Cl.⁵ .............................................. B23K 1/20
[52] U.S. Cl. .................................... 228/105; 228/223
[58] Field of Search ....................... 228/56.5, 104, 105, 228/260, 223

[56] References Cited
U.S. PATENT DOCUMENTS 5,108,024 4/1992 Kazem-Goudarzi .............. 228/56.5

OTHER PUBLICATIONS

Electronic Controls Design, Inc. Brochure (Rev. Jan. 1990).

*Primary Examiner*—Kenneth J. Ramsey
*Attorney, Agent, or Firm*—Pravel, Hewitt, Kimball & Krieger

[57] ABSTRACT

The invention provides a method that can be used on-line in a continuous printed circuit soldering process to measure and control the composition of soldering fluxes, in particular low-solids fluxes that utilize a solvent with a specific gravity close to the specific gravity of the flux composition. Samples of the flux are analyzed by ultra-violet absorption to determine solvent content and, based on this analysis, make up solvent is added to the flux composition to maintain a steady state composition.

3 Claims, 3 Drawing Sheets

METHODS FOR CONTINUOUSLY CONTROLLING FLUX COMPOSITION DURING MANUFACTURE OF PRINTED CIRCUITS

BACKGROUND OF THE INVENTION

1. Field Of the Invention

The invention relates to methods and apparatus for continuously monitoring and controlling the composition of flux used in the soldering of printed circuits.

2. Description of the Related Art

In the manufacture of printed circuit boards, a flux is applied to a board surface before the surface is contact coated with solder. Fluxes used in the printed circuit manufacturing industry usually include four components: an activator; a solvent; surfactants; and corrosion inhibitors. Typical activators include rosin acids (10–20%) and dicarboxylic acids, such as adipic acid, usually present in the range 1–2 wt. %. The most commonly used solvents are alcohols. Surfactants are often added at a rate of 0.1–0.2 wt. % to promote foaming of the flux and to act as a wetting agent in applying the foamed flux to printed boards. Corrosion inhibitors are added to reduce corrosion and prevent corrosion of metallic circuitry during the soldering process.

Flux is typically applied to the board by means of a foam head generated by aerating the flux. However, this aeration of the flux causes significant loss of solvent through evaporation. If this evaporation were to proceed unchecked, then the solids concentration of the flux would increase with time in a continuous process unless make-up solvent is added to compensate for solvent losses. Thus, either solvent loss or flux composition must be monitored to determine the quantity of make-up solvent that must be added to maintain a constant flux composition. To accomplish this, the composition of the flux is usually measured on a continuous or semi-continuous basis by sampling the flux and measuring its specific gravity. This technique is useful when there is a relatively large difference in specific gravity between the flux and the solvent. For example, the specific gravity of a typical RMA flux, such as Kester 34T18, is 0.834 while the specific gravity of a typical solvent, such as isopropyl alcohol, is 0.783. Typically, the nonvolatile residue of the flux material is about 18 wt. %.

While flux composition can therefore be relatively easily controlled, currently used rosin-based fluxes are typically cleaned from circuit board surfaces using chlorofluorocarbon (CFC) solvents. However, the United States Environmental Protection Agency (EPA) has determined that CFCs have a detrimental effect on the ozone layer in the upper atmosphere and has restricted the use of these solvents in the short term and will prohibit their use within a few years. As a result, circuit board manufacturers are converting their production operations to eliminate the use of CFC solvents for cleaning by substituting new flux materials which can be cleaned with other solvents, principally water, or which can be left on board surfaces without adversely affecting the long-term reliability of printed circuits.

The new flux materials are typically low-solids fluxes containing only about 2–5 wt. % non-volatile residue. Further, the specific gravity of a typical low-solids flux, such as Kester 951, is about 0.813, while the specific gravity of a typical solvent, such as ethanol, is 0.805. Thus, the difference between the specific gravity of the flux and the solvent is significantly less than for the higher solids rosin-based fluxes. Indeed, the specific gravity differential is too small for precise measurement and control using specific gravity as the controlled variable.

Since relatively simple specific gravity measurements cannot be used with any degree of reliability to control the composition of low solids fluxes that do not require subsequent CFC-cleaning, solvent composition may be monitored directly by gas chromatography. However, although this technique can be used online in the process environment, commercial chromatograph instrumentation is relatively expensive to install and maintain. What is needed is a method for continuously monitoring the solvent content of low solids fluxes so that, as solvent is volatilized through the aeration process, make up solvent can be added to maintain the flux composition at a desired controlled level.

SUMMARY OF THE INVENTION

The invention provides a simple, inexpensive method that can be used online in a continuous printed circuit manufacturing process to measure and control the composition of a flux. More particularly, the invention method is especially applicable when the specific gravity of the flux solvent is relatively close to the specific gravity of the flux itself when the more commonly employed specific gravity measuring techniques for control of flux composition are not reliably useful.

In the invention method, a sample of flux is removed from a flux pot which supplies a foam head of flux for coating circuit boards. The sample is then mixed with a predetermined amount of solvent before being analyzed, preferably by ultra-violet absorption, to determine the solvent content of the flux sample. Based upon this analysis, the amount of make up solvent to be added to the flux pot is determined and added to the flux pot. The invention methods thereby control the flux concentration at a predetermined level without reliance upon specific gravity or chromatographic measurements. While the invention methods are especially useful for low solids content fluxes, they are applicable for use with any flux that contains an ultra-violet light absorbent component that varies in a predictable manner with solvent concentration. Thus, the concentration of the ultra-violet absorbent component is measured, compared with a control point level, and the differential between these is determined so that the necessary amount of make-up solvent may be calculated and added to the flux pot.

The equipment needed to carry out the invention method is relatively simple and reliable so that the analysis of flux composition and adding of make up solvent may be carried out reliably and inexpensively.

DETAILED DESCRIPTION OF THE PREFERRED EMBODIMENTS

The invention provides methods for analyzing fluxes, used in conjunction with the soldering of printed circuit boards, to determine solvent content and control the solvent content of fluxes by adding make up solvent to the flux to maintain the solvent concentration at a predetermined level. In the preferred embodiment, the solvent concentration is determined by ultra-violet absorption analysis. Thus, the solvent concentration may be measured directly or may be measured by analyzing a dye or tracer composition that varies predictably with the concentration of solvent.

The invention methods are particularly applicable to those fluxes wherein the difference in specific gravity between the solvent and the flux is small, so that specific gravity measurements are not practically useful to determine solvent concentration. Such solvents include for example, isopropyl alcohol, methanol, water, and the like. The invention is also especially useful when the flux has a low solids content, preferably in the range from about 0.5 to about 5 wt. %, more preferably in the range from about 1 to about 2 wt. %.

Figure 1:
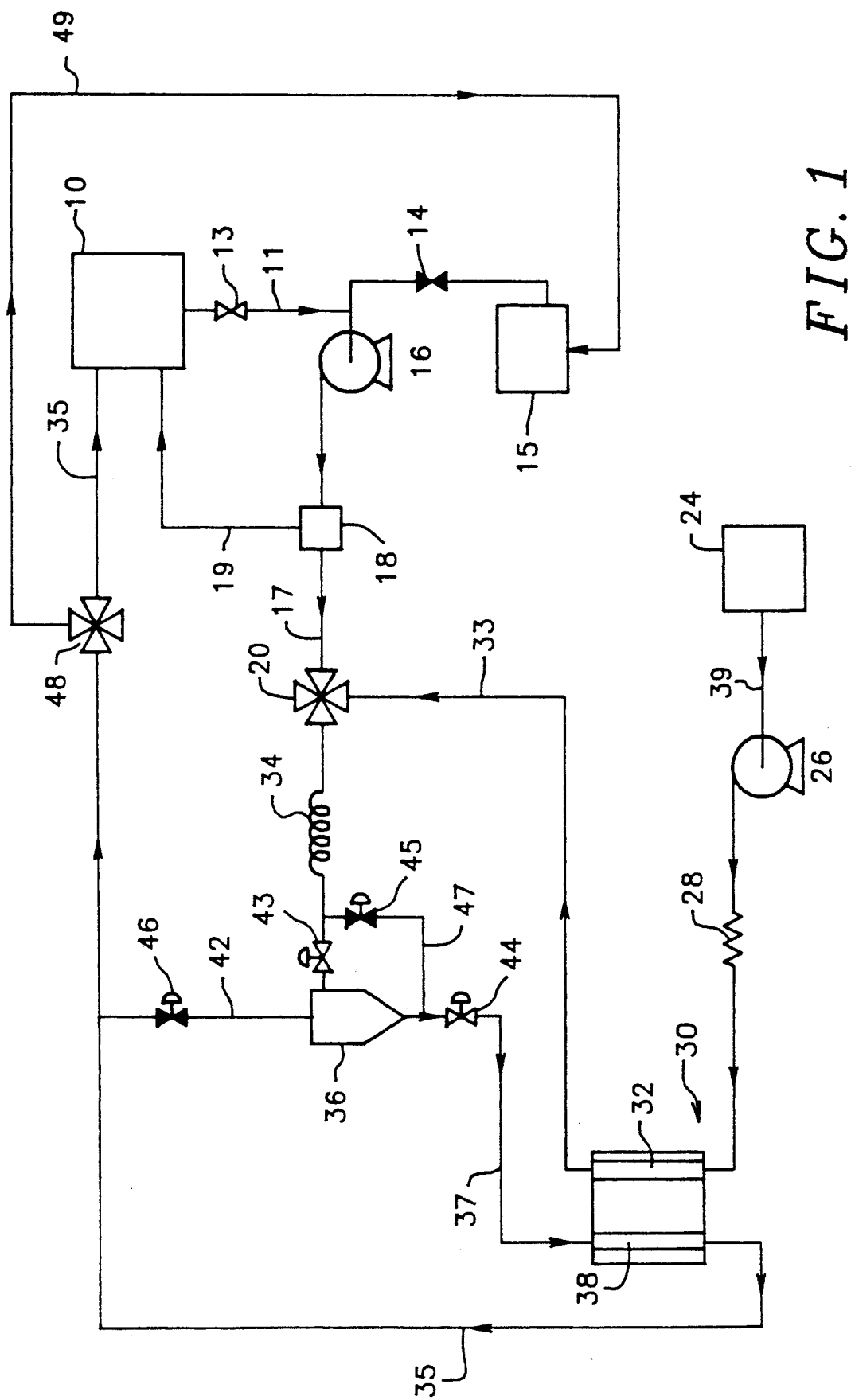
FIG. 1 is a schematic materials flow diagram of an embodiment of a sampling and analyzing system of the invention.

A preferred embodiment of the invention method is illustrated in FIG. 1 which is a schematic flow diagram of the sampling, analyzing and control system of the invention. Flux is sampled from flux pot 10 and routed through conduit 11 to the suction of pump 16. This sampling is preferably set by a timer so that samples are intermittently drawn from flux pot 10. Typically, the sampling interval is about 3 to about 10 minutes, preferably about 5 minutes. Pump 16 charges the sampled flux to analysis after removal of entrained bubbles in bubble trap 18 which routes these through conduit 19 to flux pot 10. Bubble-free flux is then routed through conduit 17 to means for mixing with the solvent, such as sample injection valve 20. In this sample injection valve, the flux is commingled with a predetermined amount of solvent. This solvent is obtained from a solvent reservoir 24 from which a predetermined amount of solvent is drawn to the suction 39 of pump 26 which preferably pumps solvent first through a pulse dampener 28, and thence through the reference ampule 32 of an ultra-violet absorbance detector 30. The solvent pumped through the reference ampule 32 exits via conduit 33 for commingling with flux mixture in the sample injection valve 20. The mixture from sample valve 20 is discharged through mixing coils 34 and thence through valve 43 to a means for particulate removal such as a filter 36. The filter 36 may be of a type that can be backwashed after use to remove particulate solids so that the filter can be reused. In the embodiment shown in FIG. 1, filter backwash may be achieved by closing valves 43 and 44; adjusting valve 20 to cut off flow of flux from pump 16 and allowing solvent from conduit 33 only to pass through; and opening valves 45 and 46. Solvent is then pumped by pump 26 through pulse dampener 28, reference ampule 32, conduit 33, valve 20, inline mixer 34, valve 45, conduit 47, filter 36, valve 46 in conduit 42 and thence to conduit 35 where valve 48 diverts the solvent used in backwashing to flux reservoir 10. In normal operation, particulate-free flux from the filter is then routed through valve 44 and conduit 37 of the ultra-violet absorbance detector 30. Thus, the ultra-violet absorbance detector 30 detects the difference in ultra-violet absorbance between the reference ampule containing solvent and the sample ampule 38 containing flux mixed with a predetermined amount of solvent. The flux-solvent mixture flows through sample ampule 38 and is routed back to the flux pot 10 via recycle conduit 35. Based upon the difference between the ultra-violet absorbance of the flux-solvent sample and the solvent reference, the concentration of solvent in the flux pot 10 can be determined.

Preferably this concentration is provided as a signal calibrated in a fashion to operate with conventional prior art flux controllers which utilize a specific gravity related input. By calibration in this manner major portions of equipment previously utilized can be utilized, thus effecting a cost savings.

To calibrate the invention analyzer system, a sample of standard flux of known concentration is analyzed in the sample ampule 38 and the result compared with the analysis from the reference ampule 32. The ultraviolet absorbance instrument is calibrated to equalize the readings since each ampule should contain only solvent. In the embodiment in FIG. 1, calibration may be effected by closing flux pot valve 13 and allowing standard flux flow from standard flux container 15 through valve 14 to the suction of pump 16. This standard flux is then pumped through valve 20, inline mixer 34, filter 36 to sample ampule 38, displacing any flux/solvent mixture in the conduits, mixer and filter ahead of it. After a sufficient time has elapsed and sufficient solvent has flowed to clear flow areas, especially the sample ampule 38 of flux, readings can be taken for calibration. Flux exiting the sample ampule 38 is routed via conduit 35 through valve 48 to line 49 for recycle to the flux standard container 15. The initial containing flux (from flux pot 10 and solvent from reservoir 24) held up in the instrument conduits, mixer, filter and ampule is routed via valve 48 to flux reservoir 10 to avoid contamination of the solvent reservoir 24.

Preferably the flux standard is of such a concentration that it approximates the desired concentration of the flux in flux pot 10 after the flux pot 10 has been diluted with solvent in mixing valve 20. Thus, when the ultra-violet absorber is being calibrated, mixing valve 20 is adjusted so that no solvent flows from conduit 33 to the in-line mixer 34.

The following non-limiting example is illustrative of an embodiment of the invention as disclosed above and claimed herebelow.

EXAMPLE

A low-solids flux was prepared using isopropyl alcohol as a solvent. The flux components included solvents, activators, corrosion inhibitors, and surfactants. A sampling and control system corresponding essentially to the schematic diagram of FIG. 1 was prepared for sampling, analyzing and controlling flux solvent concentration. Flux was withdrawn from a flux pot and pumped to a sample injection valve which was activated every five minutes by a cam timer, thereby injecting a 10 microliter sample of flux into a solvent stream, which was flowing at 1.0 milliliters per minute. The flux sample was diluted in the ratio 1:50 and mixed with solvent in a mixing coil, which consisted of about 10 ft. of 0.8 millimeter inside diameter Teflon ® tubing wound around a 4 inch segment of 1 inch outside diameter pipe. The diluted sample passed through a 10 micron filter and thence through the sample side of an ultra-violet spectrophotometric detector (LDC Analytical "uv-Monitor" Part #870091 set to detect at 254 nanometers.

The sample required approximately 2.5 minutes to flow through the detector cell.

In the particular apparatus utilized, the 10 micron filter was of a kind that can be backwashed with solvent exiting from the detector. A six-port filter/backwash valve was activated by another cam switch on the timer so that a backwash began when a new sample was injected. The backwash continued for a period of about two minutes to flush flux solids from the filter to flux pot 10.

To conserve solvent, it was recognized that it would be desirable to recirculate the portion of the solvent stream not containing the flux sample to the solvent reservoir. The portion containing the flux sample is sent to the flux pot 10.

Figure 2:
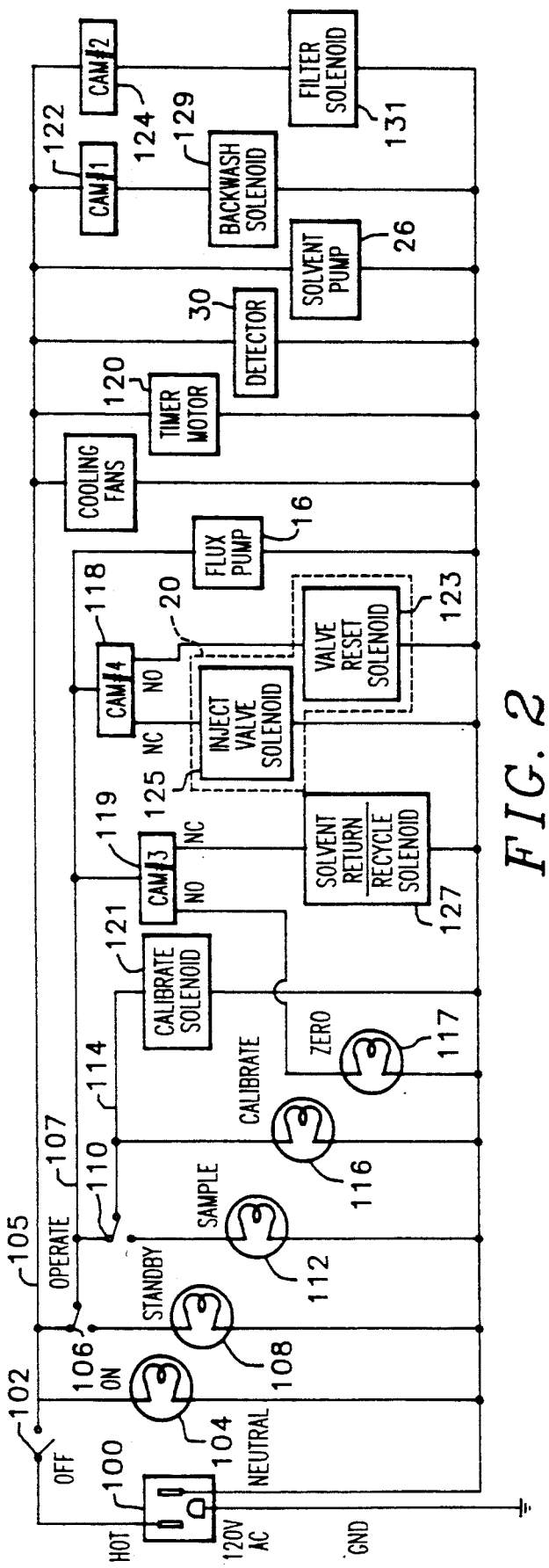
FIG. 2 is a block diagram of the switches, indicator lights and control solenoids of an embodiment of a sampling and analyzing system of the invention.

Referring now to FIG. 2, the block diagram of the solenoids, indicator lights and switch controls of the preferred embodiment is shown. An AC power receptacle 100 is present to receive an AC power source. A single pole switch 102 is connected to the hot line of the receptacle 100 to act as the on/off switch. The ground line is connected to ground, while a neutral line is also present in the receptacle 100. A light 104 is connected between the AC power rail 105 provided from the on/off switch 102 and the neutral line, so that when the on/off switch 102 is closed, the on status of the device is indicated. A two position switch 106 has its common connected to the power rail 105. A first position of the switch 106 is connected to a standby lamp 108, which is also connected to the neutral line. Thus when the switch 106 is in this first position the unit is indicated as being in standby mode. In the second position an operating power line 107 is connected to the second position of the switch 106.

A two position switch 110 has its common connection connected to the operating power line 107. This is the sample or calibrate switch. The first pole of the switch 110 is connected to a sample lamp 112 which is connected to the neutral line. The second position of the switch 110 provides the calibrate power 114 and is connected to a calibrate lamp 116 which is also connected to the neutral. Calibrate power line 114 is connected to a calibrate solenoid 121, which operates valves 13 and 14, so that when activated valve 14 is open and valve 13 is closed. The calibrate solenoid 121 is connected to ground.

Several items are connected to the operating power line 107. As a first item, the flux pump 16 is connected between the operating power line 107 and the neutral line. The second item connected is the fourth cam 118 of a timer motor 120. The timer motor 120 is used to control activation and timing of the operations of the device. The timing motor 120 contains a timer motor which rotates a shaft. Connected to this shaft is a plurality of cams which open and close switches according to the position of the cam. The cams are preferably adjusted so that the timing of events based on the timer motor 120 is properly developed as described above. A normally open output from the fourth cam 118 is provided to a valve reset solenoid 123 used in the sample injection valve 20 to close the sampling of the valve 20. A normally closed contact from the fourth cam 118 is connected to an injection valve solenoid 125 used in the sample injection valve 20 to allow a sample to be injected.

A third cam 119 is also connected to the operating power line 119. A normally open contact is connected to a zero light, 117, to indicate that a clean solvent is flowing in the sample ampule 38, thus indicating that a sampling operation is not currently ongoing A normally closed contact is connected to a recycle solenoid 127. The recycle solenoid 127 operates the valve 48, so that clean solvent is recycled to the solvent reservoir 24, while solvent containing a sample or during a backwash is provided to the flux pot 10.

The timer motor 120 is connected between the AC power rail 105 and neutral. The absorbance detector 30 is also connected between the AC power rail 105 and neutral, as is the solvent pump 26. A first cam 122 is connected to the AC power rail 105 and a backwash solenoid 129, the other terminal of the backwash solenoid 129 being connected to the neutral line. The backwash solenoid 129 operates valves 45 and 46, so that valves 45 and 46 are closed when the backwash solenoid 129 is not energized and valves 45 and 46 are open when the backwash solenoid 129 is energized. A second cam 124 is connected between the AC power rail 105 and a filter solenoid 131, with the filter solenoid 131 being connected to the neutral line. The filter solenoid 131 operates valves 43 and 44 so that valves 43 and 44 are closed when the filter solenoid 131 is not energized and valves 43 and 44 are open when the filter solenoid 131 is energized. Thus cams 122 and 124 have complementary timing.

Figure 3:
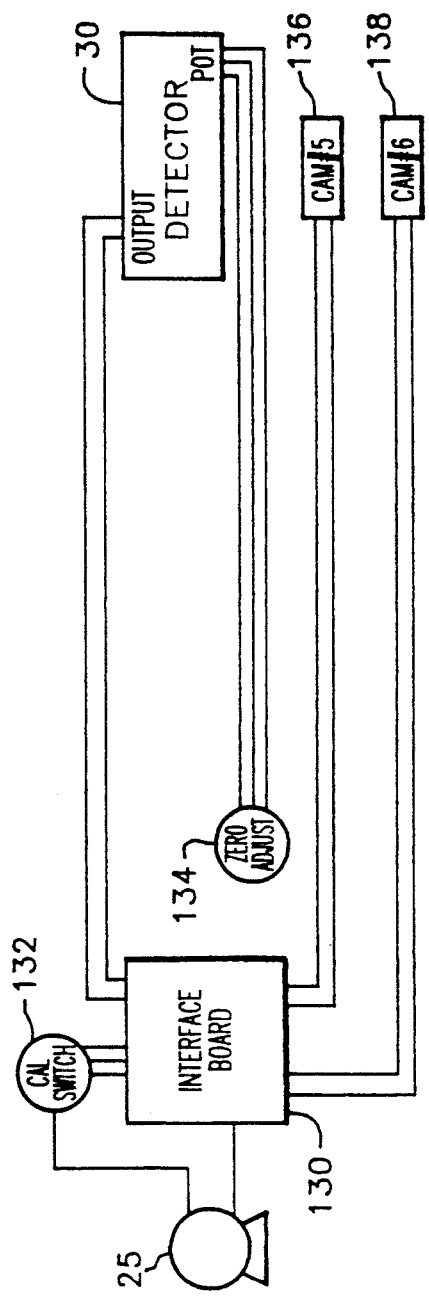
FIG. 3 is a block diagram of the switches, detector, conventional flux controller and electronics interface module.

As shown in FIG. 3, an interface electronics board 130 is connected to a conventional flux controller 25. A calibration switch 132 selects from three outputs of the interface board 130, a sample output and two calibrated outputs corresponding to a 5 gram mass and a no mass, and provides air output as needed to the controller 25. The detector 30 has its output lines connected to the interface board 130 and has a zero adjust potentiometer 134 connected to its potentiometer inputs for calibration. Additionally, fifth and sixth cams 136 and 138 from the timer motor 120 are provided to the interface board for timing functions of the electronics.

Figure 4:
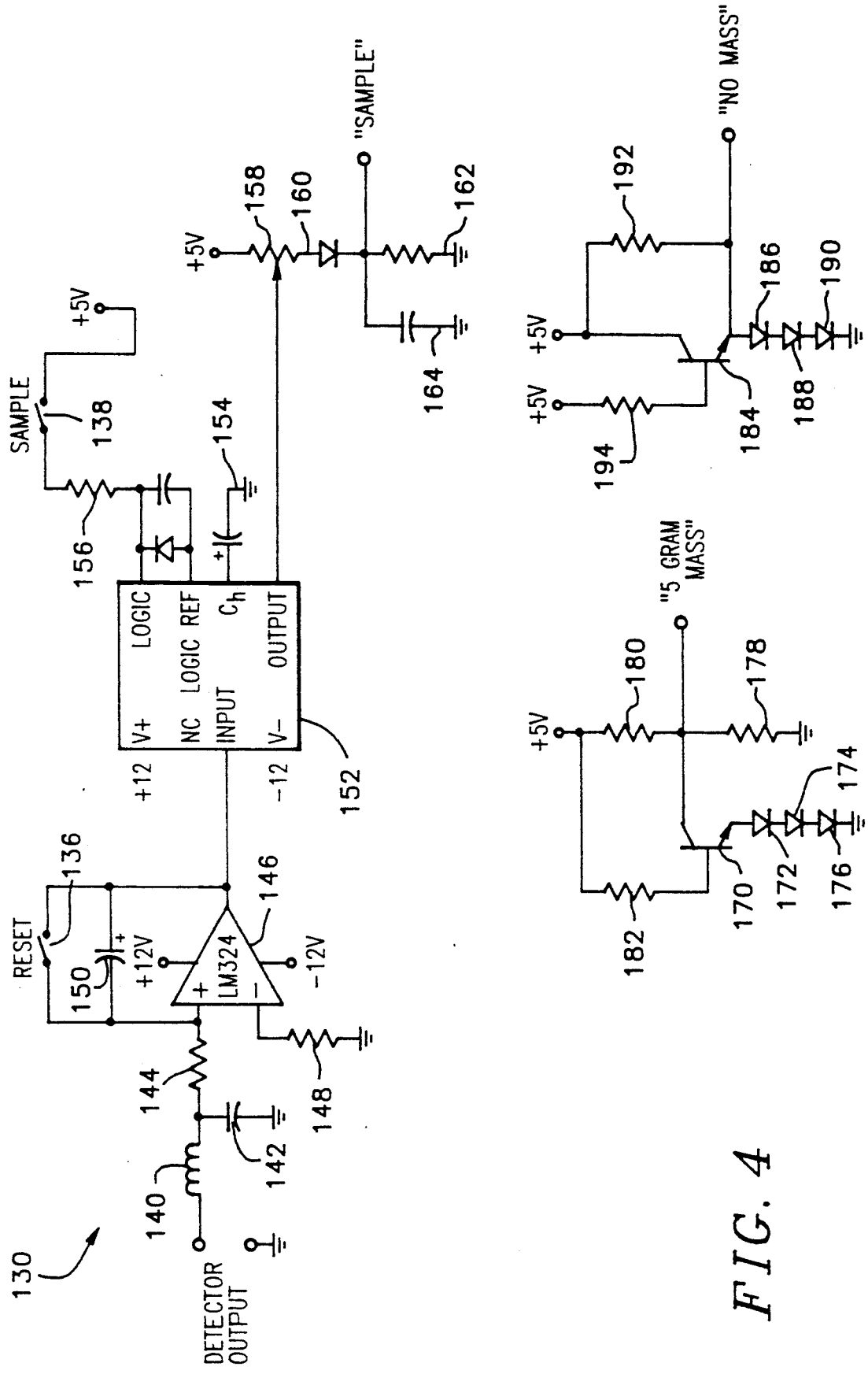
FIG. 4 is a schematic diagram of the interface module used in the sampling and analyzing system of FIG. 3 to connect to a conventional flux controller.

Referring now to FIG. 4, the interface board 130 is shown in more detail. The detector output is provided to ground and to one terminal of an inductor 140. The other terminal of the inductor 140 is connected to a capacitor 142, which is connected to ground. The second terminal of the inductor 140 is also connected to one terminal of a resistor 144, whose second terminal is connected to the non-inverting input of an operational amplifier 146. The inverting input of the operational amplifier 146 receives a resistor 148 connected to ground. A capacitor 150 is connected from the output of the operational amplifier 146 to the non-inverting input. Thus the operational amplifier 146 is configured as an integrator. The contacts of cam 136 are provided as a reset switch across the capacitor 150 to act to reset the integrator. This reset switch is closed just before the peak of the output provided by the detector 30 to allow a full integration cycle of the detector output.

The output of the operational amplifier 146 is also provided to the input of a sample and hold unit 152. A large capacitor 154, on the order of 50,000 µF, in the preferred embodiment, is connected to the capacitor input of the sample and hold unit 152. A resistor 156 is connected between the sample input of the sample and hold unit 152 and the one terminal of the contacts of cam 138. The other terminal of the contacts of cam 138 is connected to a logic high level. The contacts are then closed after the peak is provided by the detector 30 so that the integrated value is then held for a period approximating 5 minutes in the preferred embodiment.

This relatively long time is the reason for the large capacitor 154. While there is actually some sagging of the voltage components over this long period, it is relatively minor for the purposes herein. The output of the sample and hold unit 152 is provided to the wiper of a potentiometer 158. One terminal of the potentiometer is unconnected, while the other terminal is connected to the cathode of a diode 160. The cathode of the diode provides the sample output which is provided to the conventional flux controller 25 and is also connected to a resistor 162 which is connected to ground and a parallel capacitor 164 which is connected to ground. Thus the potentiometer 158 and resistor 162 act as a voltage divider, with the capacitor 164 providing filtering and the diode 160 providing feedback protection. The voltage output levels provided by the resistor divider are selected to simulate the output levels provided by a conventional prior art specific gravity-based flux analyzer. This is done by a combination of the level provided by the operational amplifier 146 and the divider output. This output level is preferred because it allows reuse of the major components of the flux controller, requiring changing of only the concentration measuring components.

It is noted that the calibration switch also has two other inputs needed to calibrate the flux controller 25. One of these is an indication that a 5 gram mass has been applied. This 5 gram mass signal is provided at the collector of an NPN transistor 170. The emitter of the transistor 170 is connected to ground through three diodes 172, 174 and 176. The collector is also connected to ground through a resistor 178 and is pulled up to a logic high level by a resistor 180. A resistor 182 is connected between the logic high level and the base of the transistor 170 to provided biasing. This arrangement is calibrated so that the output voltage provided at the collector of the transistor is that which would have been generated by the equipment utilized with the flux controller 25 for the 5 gram standard, which is one volt in the preferred embodiment.

It is also necessary to provide a no mass calibration input for the flux controller 25. An NPN transistor 184 has its emitter connected to ground through three diodes 186, 188 and 190. The collector of the transistor 184 is connected to a logic high level, with a resistor 192 connected between the collector and the emitter. A resistor 194 is connected between a logic high level and the base of the transistor 184. The emitter of the transistor 184 provides the no mass signal which has an effective output voltage of 2 volts in the preferred embodiment. In this manner with calibration of the flux controller 25 can be performed because the calibration switch 132 need only be selected and the proper voltage level is provided, either of the two calibrations standards or the sample voltage.

Although the invention has been described with reference to its preferred embodiments, those of ordinary skill in the art may, upon reading this disclosure, appreciate changes and modifications which do not depart from the scope and spirit of the invention as described above or claimed hereafter.

We claim:

1. A method of determining and controlling the solvent concentration of a flux for soldering circuit boards, the method comprising:
    (a) sampling flux being used in a solder process for circuit boards, said flux comprising a solvent, said solvent having a specific gravity close to the flux specific gravity;
    (b) analyzing the sampled flux by ultra-violet absorbance to determine solvent content;
    (c) comparing analyzed solvent content with a control solvent content;
    (d) determining an amount of solvent to be added to the flux being used in the process so that solvent concentration of said flux is substantially equal to the control solvent content; and
    (e) adding the determined amount of solvent to the flux being used in the process.

2. The method of claim 1 wherein the solvent is selected from the group consisting of ethanol, isopropyl alcohol, methanol, and water.

3. The method of claim 1 wherein the flux solids content is from about 0.5 to about 5 wt. %.

* * * * *